(12) United States Patent
Miyashita

(10) Patent No.: US 8,158,472 B2
(45) Date of Patent: Apr. 17, 2012

(54) STRUCTURES OF SRAM BIT CELLS

(75) Inventor: Katsura Miyashita, Fishkill, NY (US)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 12/860,972

(22) Filed: Aug. 23, 2010

(65) Prior Publication Data

US 2010/0314692 A1    Dec. 16, 2010

Related U.S. Application Data

(62) Division of application No. 12/020,086, filed on Jan. 25, 2008, now abandoned.

(51) Int. Cl.
*H01L 21/338* (2006.01)

(52) U.S. Cl. ...................................... 438/197

(58) Field of Classification Search .................. 438/197, 438/174
See application file for complete search history.

(56) References Cited

U.S. PATENT DOCUMENTS

| | | | |
|---|---|---|---|
| 6,984,564 B1 | 1/2006 | Huang et al. | |
| 7,060,549 B1 | 6/2006 | Craig et al. | |
| 7,547,947 B2 | 6/2009 | Anderson et al. | |
| 7,605,447 B2 | 10/2009 | Doris et al. | |
| 2004/0067619 A1* | 4/2004 | Niimi et al. | 438/275 |
| 2005/0285202 A1* | 12/2005 | Huang et al. | 257/368 |
| 2006/0228860 A1* | 10/2006 | Shinohara et al. | 438/257 |
| 2007/0063278 A1 | 3/2007 | Doris et al. | |
| 2007/0108528 A1 | 5/2007 | Anderson et al. | |
| 2007/0257308 A1 | 11/2007 | Lee et al. | |
| 2007/0264762 A1 | 11/2007 | Yeo et al. | |
| 2008/0105932 A1 | 5/2008 | Liaw | |
| 2008/0111162 A1 | 5/2008 | Yang et al. | |
| 2009/0108356 A1* | 4/2009 | Cheng et al. | 257/365 |
| 2009/0121258 A1 | 5/2009 | Kumar | |

* cited by examiner

*Primary Examiner* — Thao P. Le
(74) *Attorney, Agent, or Firm* — Banner & Witcoff, Ltd.

(57) ABSTRACT

A SRAM bit cell and an associated method of producing the SRAM bit cell with improved performance and stability is provided. In one configuration, channel mobility of the transistors within the SRAM bit cell may be adjusted to provide improved stability. In order to adjust the channel mobility, a stress memorization technique may be used, a wide spacer may be used, germanium may be implanted on tensile stress silicon nitride, a compressive liner may be used or silicon germanium may be embedded in one or more of the devices in the cell. In another configuration, the gate capacitance of each device within the SRAM bit cell may be adjusted to achieve high SRAM yield. For instance, a thick gate oxide may be used, phosphorous pre-doping may be used or fluorine pre-doping may be used in one or more of the devices within the cell.

10 Claims, 13 Drawing Sheets

US 8,158,472 B2

STRUCTURES OF SRAM BIT CELLS

CROSS REFERENCE TO RELATED APPLICATIONS

This application is a divisional of U.S. patent application Ser. No. 12/020,086, entitled "Structures of SRAM Bit Cells", filed Jan. 25, 2008, which is incorporated herein by reference in its entirety.

BACKGROUND

Static random access memory (SRAM) cells have occupied a large portion of the Large Scale Integrated (LSI) device chip market as higher volume memory has become a desired feature. However, as further chip developments are made, enhancing performance and stability of SRAM cells remains an important factor.

To improve performance and stability of SRAM cells, channel widths and lengths are adjusted to produce a high SRAM yield. However, this method has become less effective when producing high density SRAM cells because pull-down field effect transistors (FETs) with wide channel width and pass-gate FETs with wide gate length increase SRAM array size. In addition, non-constant gate pitch degrades the lithography margin. As a result, gate length variation becomes large, which degrades SRAM stability. Further, constantly adjusting channel widths and lengths makes cell design more difficult across a chip. Finally, doping agent out-diffusion and/or process induced stress tend to cause unexpected electrical behavior in SRAM FETs. Therefore, actual on current ratios may be altered from the design ratio, thereby making circuit design difficult.

SUMMARY

This summary is provided to introduce a selection of concepts in a simplified form that are further described below in the Detailed Description. This summary is not intended to identify key features or essential features of the claimed subject matter.

There is a need for an SRAM bit cell structure that can provide improved performance and stability. The methods provided maintain the same size and shape for each device, while changing the processing technique to enhance channel mobility or adjust gate capacitance to improve performance. In at least one aspect of the invention, a standard cell size makes chip designing easier.

In one configuration, channel mobility of the transistors within the SRAM bit cell may be adjusted to provide improved stability. In order to adjust the channel mobility, a stress memorization technique may be used on pull-down n-type field effect transistors, but not on pass-gate n-type field effect transistors to improve channel mobility. In an alternate arrangement, a wide spacer may be used in the pass-gate devices, but not in the pull-down devices, to improve channel mobility. In yet another arrangement, germanium may be implanted on tensile stress silicon nitride in the pass-gate region in order to reduce or eliminate tensile stress effect in this region to improve channel mobility. In yet another arrangement, a compressive liner may be used in the pull-up and pass-gate regions, while a tensile stress liner may be used in the pull-down regions to improve channel mobility. Finally, silicon germanium may be embedded in the pull-up and pass-gate regions to cause uniaxial compressive stress in the Si channel to improve channel mobility.

In another configuration, the gate capacitance of each device within the SRAM bit cell may be adjusted to achieve high SRAM yield. For instance, a thick gate oxide may be used in the pass-gate region, but not on the pull-down region, to adjust gate capacitance. In another example, phosphorous pre-doping may be used in the pull-down region, but not in the pass-gate region to adjust gate capacitance. In yet another example, fluorine pre-doping may be used in the pass-gate region, but not in the pull-down region to adjust gate capacitance.

These and other aspects of the disclosure will be apparent upon consideration of the following detailed description of illustrative embodiments.

BRIEF DESCRIPTION OF THE DRAWINGS

A more complete understanding of the present invention and the potential advantages thereof may be acquired by referring to the following description of illustrative embodiments in consideration of the accompanying drawings, in which like reference numbers indicate like features, and wherein.

DETAILED DESCRIPTION

The various aspects summarized previously may be embodied in various forms. The following description shows by way of illustration of various embodiments and configurations in which the aspects may be practiced. It is understood that the described embodiments are merely examples, and that other embodiments may be utilized and structural and functional modifications may be made, without departing from the scope of the present disclosure.

It is noted that various connections are set forth between elements in the following description. It is noted that these connections in general and, unless specified otherwise, may be direct or indirect and that this specification is not intended to be limiting in this respect.

Figure 1:
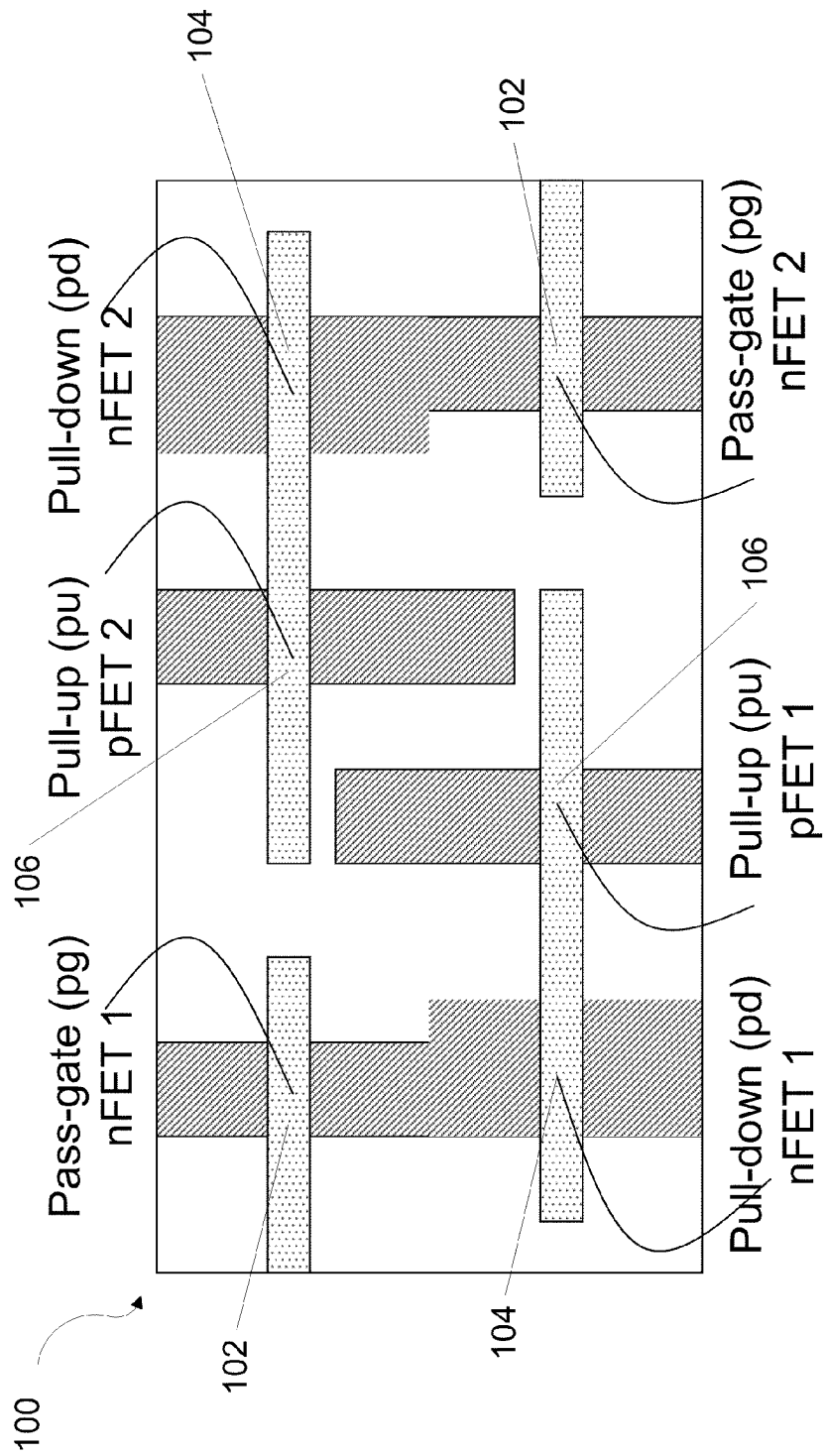
FIG. 1 is top down image of an SRAM bit cell as known in the prior art.

FIG. 1 illustrates a top down image of a conventional SRAM bit cell. The cell includes 6 transistors: two pass-gate n-type field effect transistors (nFETs) 102, two pull-down nFETs 104 and two pull-up p-type FETs 106. The beta ratio of each of these transistors is:

$$I_{on}(pd) = \frac{\mu(pd)C_{ox}(pd)}{2} \cdot \frac{W(pd)}{L(pd)} \cdot (V_g - V_t(pd))^2$$

$$I_{on}(pg) = \frac{\mu(pg)C_{ox}(pd)}{2} \cdot \frac{W(pg)}{L(pg)} \cdot (V_g - V_t(pg))^2$$

$$I_{on}(pu) = \frac{\mu(pu)C_{ox}(pu)}{2} \cdot \frac{W(pu)}{L(pu)} \cdot (V_g - V_t(pu))^2$$

where:
$I_{on}$ is the drain current
$\mu$ is the channel mobility
$C_{ox}$ is the gate capacitance
W is the channel width
L is the channel length
$V_t$ is a threshold voltage
$V_g$ is a gate voltage To improve the stability of the SRAM cell, the ratio of $I_{on(pd)}$ to $I_{on(pg)}$ is of importance. To improve SRAM write margin, the ratio of pass-gate on current ($I_{on(pg)}$) to pull-up on current ($I_{on(pu)}$) is of importance. These ratios may be important factors for producing high SRAM yield at low voltage operation.

Channel Mobility Adjustment

The ratios described above may be adjusted by adjusting the channel widths, W and lengths, L in accordance with aspects of the present invention. However, these adjustment procedures have some deficiencies. In one arrangement using aspects of this disclosure, the design ratio (W to L) may be the same, however, different processing techniques may be used to adjust gate capacitance or adjust channel mobility, in order to alter performance to the desired level.

Figure 2:
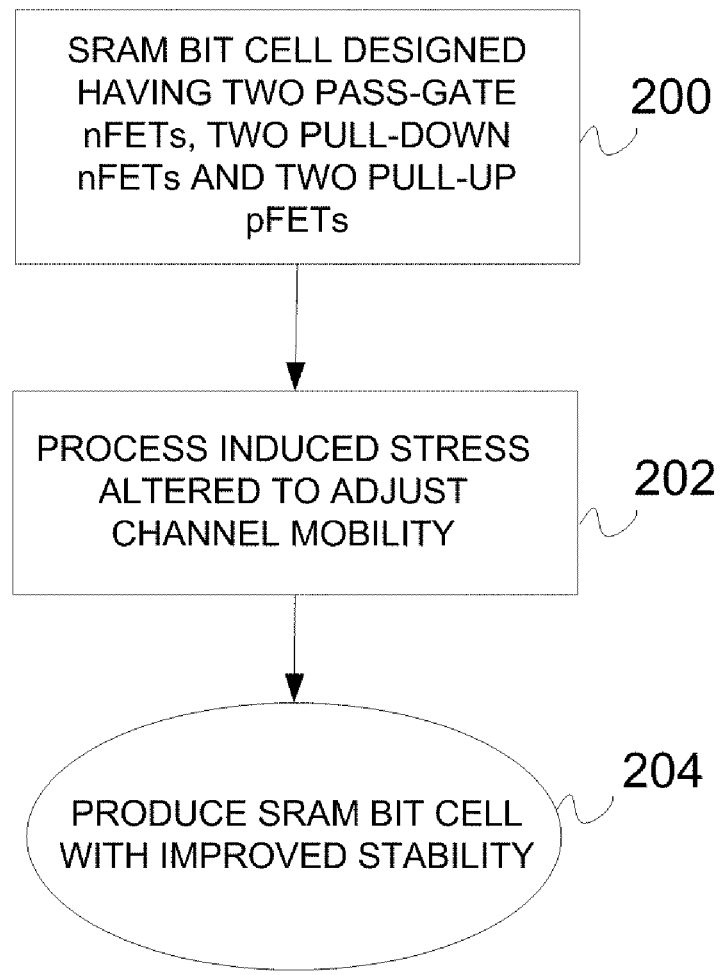
FIG. 2 is a flow diagram showing illustrative steps of one method of producing an SRAM bit cell with improved stability in accordance with one or more aspects of the present invention.
Figure 3:
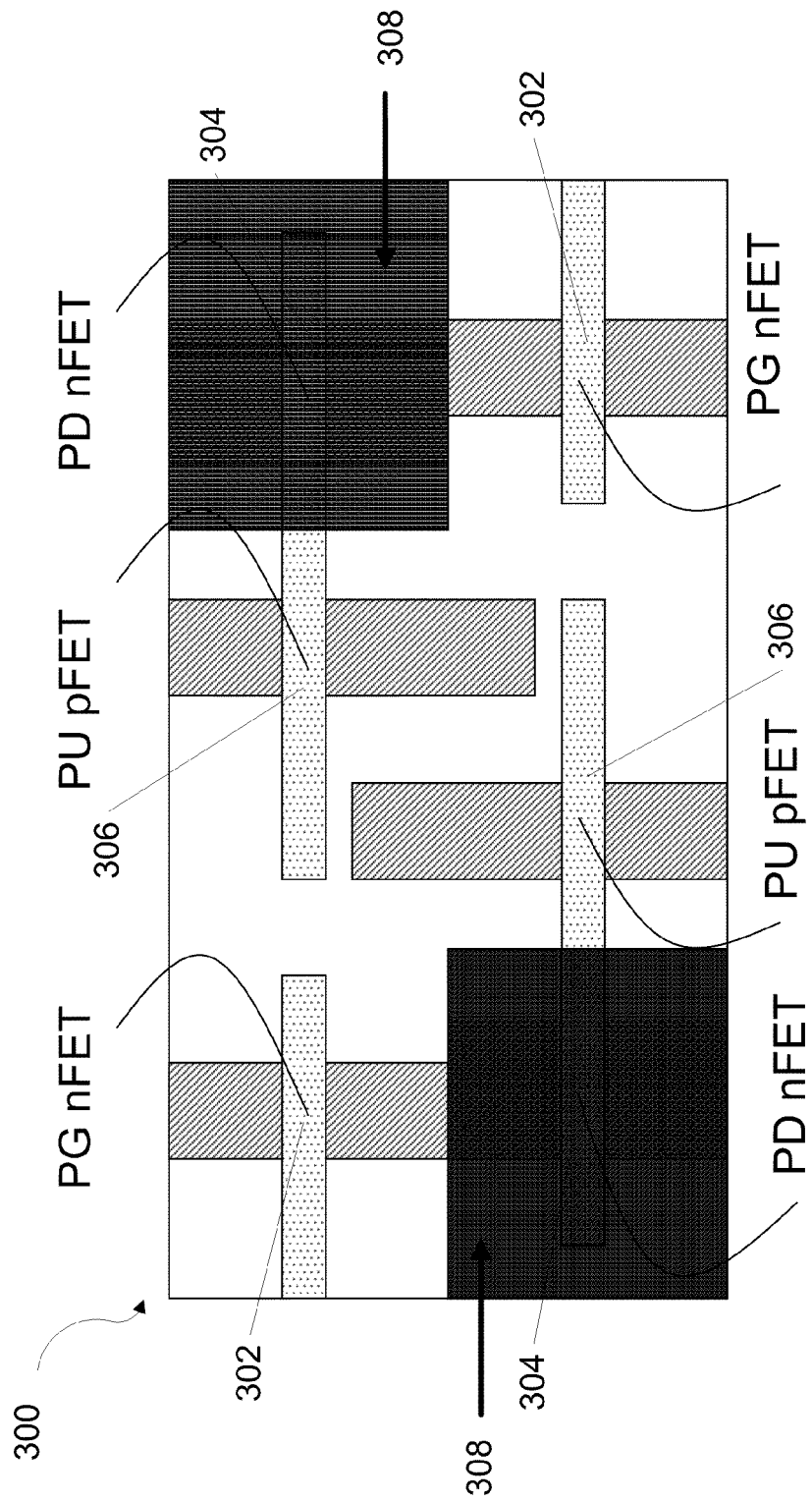
FIG. 3 is a top down image of an SRAM bit cell utilizing stress memorization technique to improve SRAM stability in accordance with one or more aspects of the present invention.

FIG. 2 illustrates one method of adjusting channel mobility of each device. In step 200, an SRAM bit cell is produced having two pass-gate nFETs, two pull-down nFETs and two pull-up nFETs. In step 202, process-induced stress may be altered to adjust channel mobility for pull-down, pass-gate and pull-up FETs. In step 204, an SRAM bit cell is produced with improved stability. For example, FIG. 3 illustrates an SRAM bit cell 300 according to one arrangement of the method shown in FIG. 2. In this configuration, a stress memorization technique is used on pull-down FETs 304. However, the stress memorization technique is not used on pull-up FETs 306 or pass-gate FETs 302. This lack of processing the pull-up FET's 306 or pass-gate FET's 306 while processing the pull-down FET's 304 may produce a large PD/PG beta ratio.

In the configuration of FIG. 3, a nitride layer 308 is deposited on the transistor. A lithography or etching process may then be performed on the device. The transistor is then subjected to a high temperature annealing process, causing regions covered by the nitride 308 to recrystallize, introducing strain. In one arrangement, the high temperature annealing process may include heating to temperatures greater than 1000° C. The nitride layer 308 is then removed, however, the strain remains. The stress memorization technique is used on nFETs to enhance uniaxial tensile stress. In this configuration, the technique can be used on pull-down nFETs 304 but not pass gate nFETs 302 to produce a large PD/PG beta ratio. This high ratio may improve SRAM stability. Although this description of a stress memorization technique may be used, alternate methods of implementing a similar technique may also be used to provide similar results.

Figure 4A:
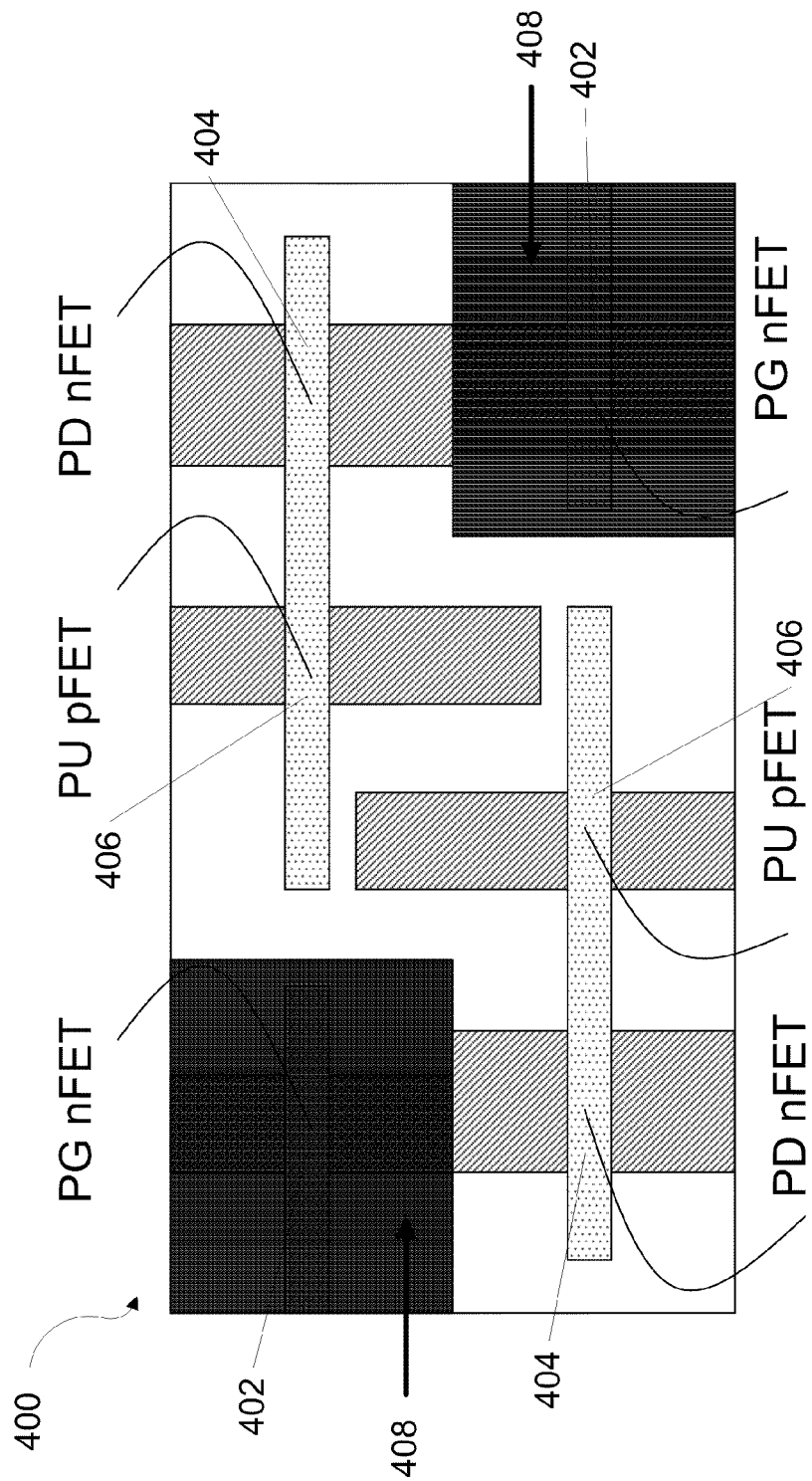
FIG. 4A is a top down image of an SRAM bit cell utilizing wide spacers to improve SRAM stability in accordance with one or more aspects of the present invention.

FIG. 4A illustrates another arrangement for adjusting channel mobility. It is generally known that nFETs with a narrow spacer can receive higher tensile effect from a contact liner. In this configuration, a wide spacer 408 may be used in the pass-gate nFET 402 but not in the pull-down nFET 404. These spacers may be formed in a variety of ways that are generally known in the art. This configuration may provide a high PD/PG ratio, thereby providing increased SRAM stability.

Figure 4B:
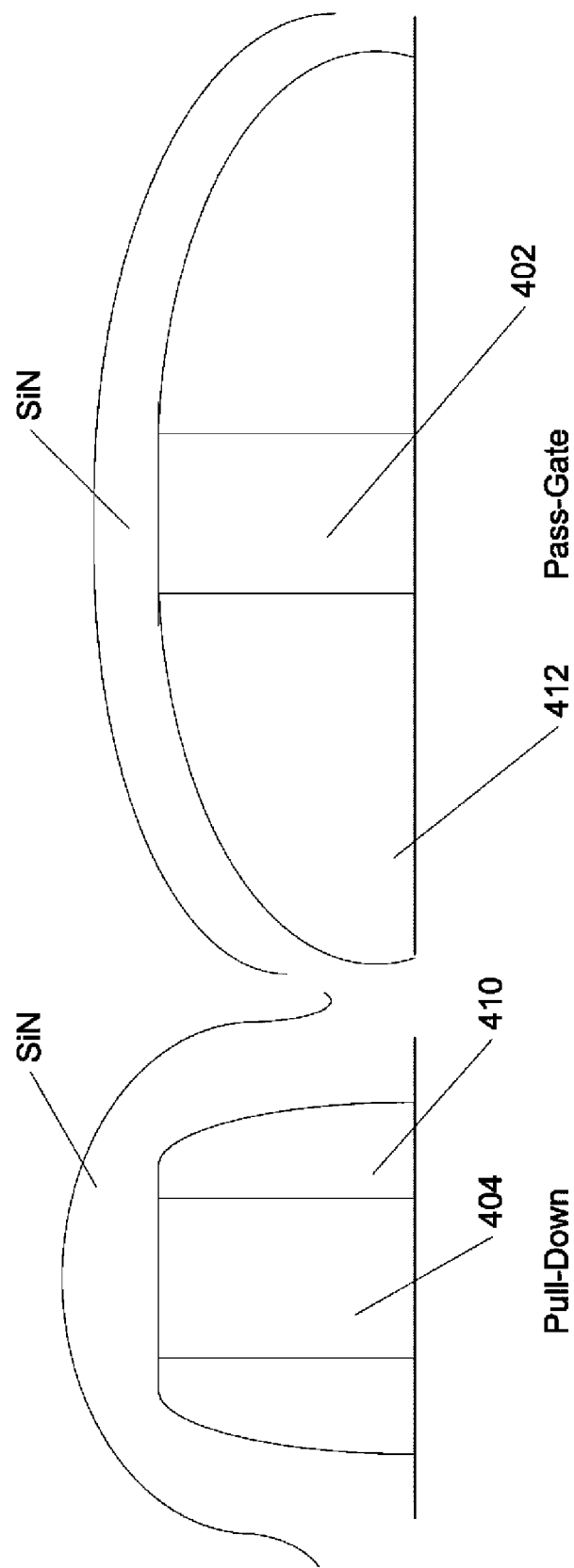
FIG. 4B is an alternate depiction of portions of the SRAM bit cell of FIG. 4A.

FIG. 4B further illustrates the arrangement of FIG. 4A. A narrow spacer 410 may be used with the pull-down field effect transistors 404 to provide a higher tensile stress. In the arrangement shown in FIG. 4B, the narrow spacer 410 may be 10 to 30 μm, as in a conventional arrangement. In addition, a wider spacer 412 is used with the pass-gate field effect transistors 402. This arrangement may provide a lower tensile stress, thereby increasing the PD/PG ratio. In the arrangement shown, the wide spacer 412 used may be 30 to 60 μm.

Figure 5:
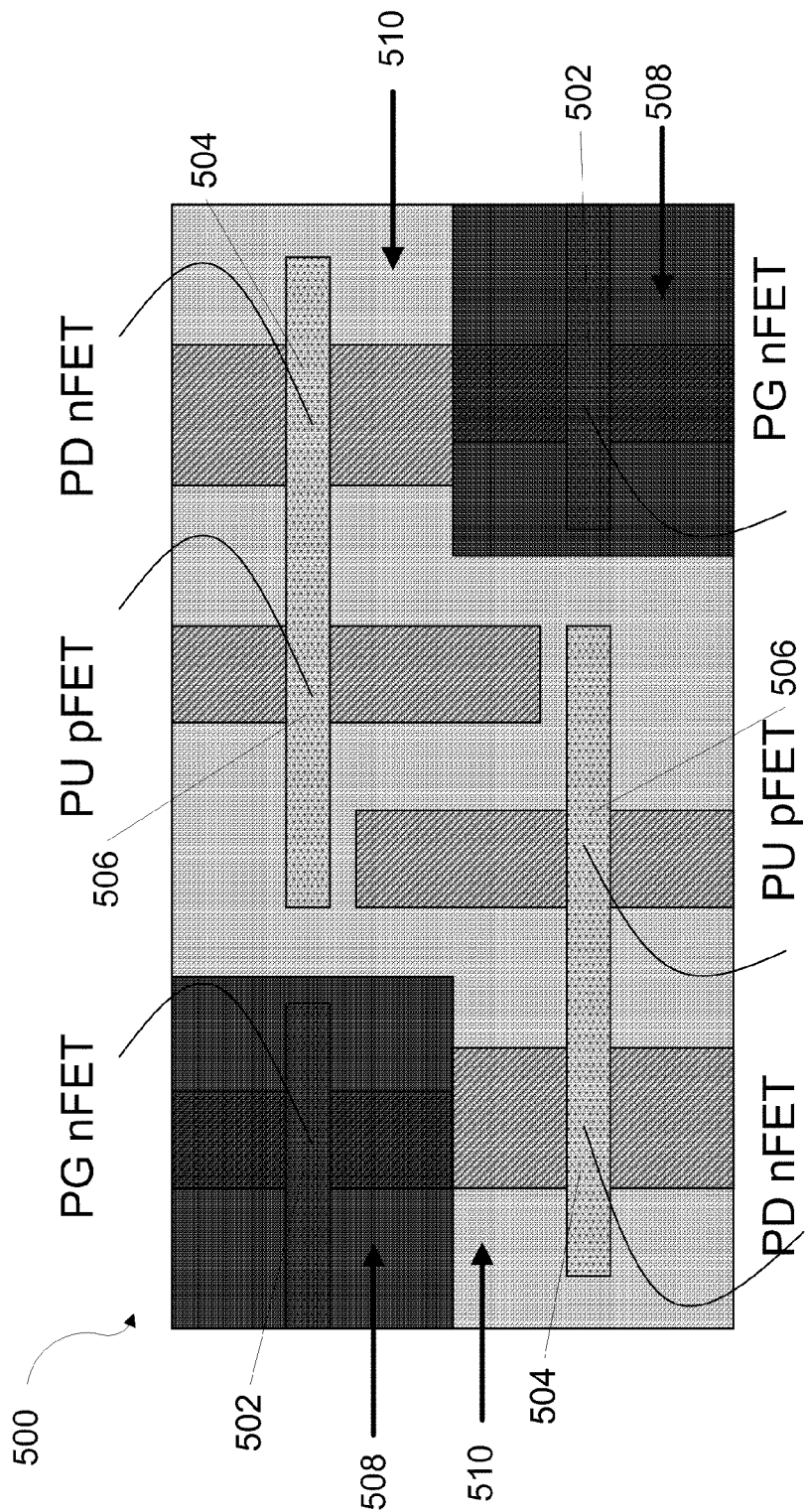
FIG. 5 is a top down image of an SRAM bit cell with germanium implanted on tensile stress silicon nitride to improve SRAM stability in accordance with one or more aspects of the present invention.

FIG. 5 illustrates yet another arrangement for adjusting channel mobility. In the configuration of FIG. 5, germanium 508 may be implanted on tensile stress silicon nitride 510 in the pass-gate area 502, while no germanium is implanted in the pull-down area 504. This may greatly reduce or eliminate tensile stress effect in this region. The difference between the stress of the pass-gate region 502 and the stress of the pull-down region 504 may produce a high PD/PG beta ratio. This high ratio may provide improved SRAM stability.

Figure 6:
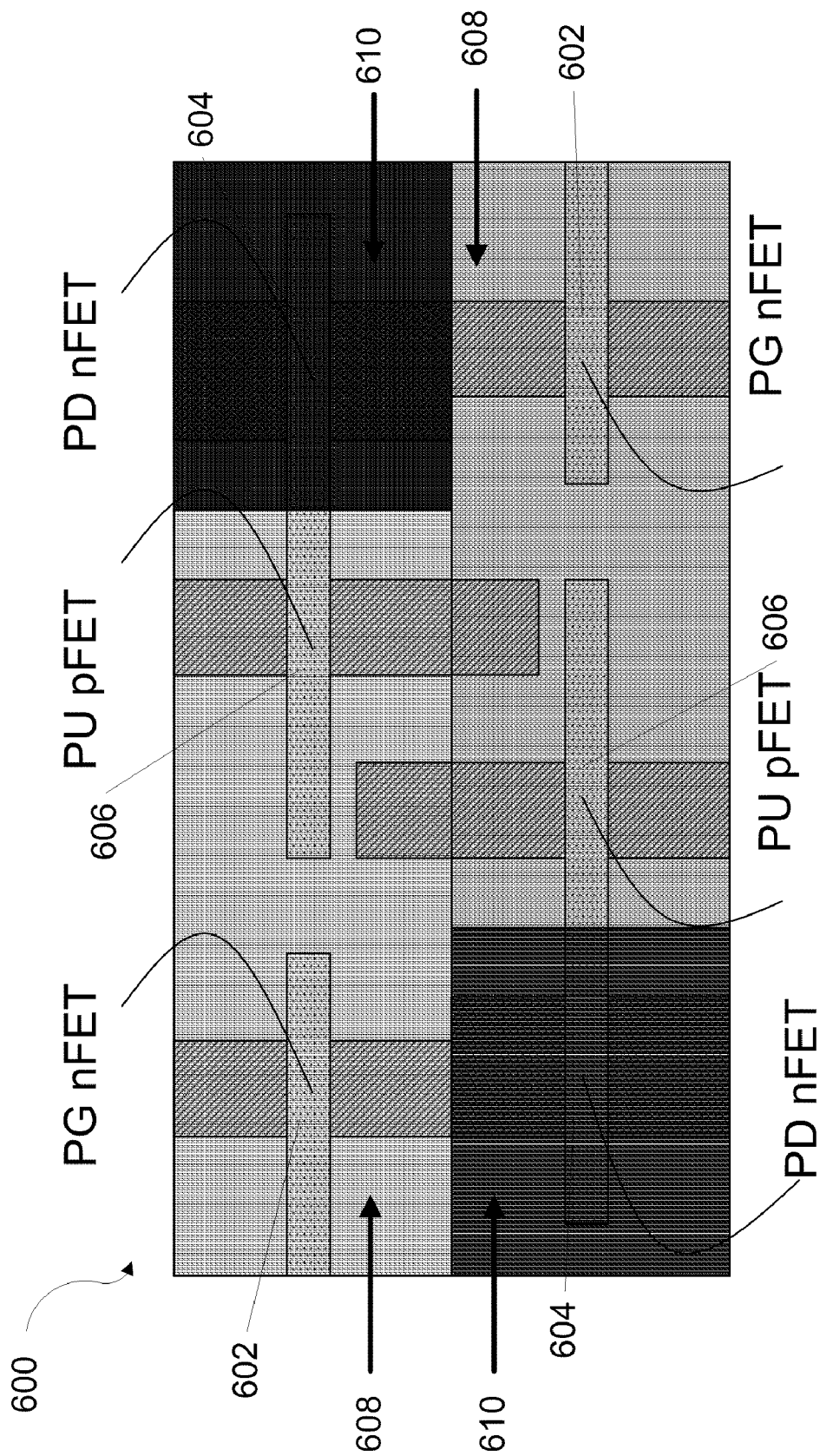
FIG. 6 is a top down image of an SRAM bit cell utilizing compressive and tensile liners to improve SRAM stability in accordance with one or more aspects of the present invention.

FIG. 6 illustrates yet another arrangement for adjusting channel mobility. In the configuration of FIG. 6, a compressive stress liner 608 may be placed on the pull-up 606 and pass-gate transistors 602, while a tensile stress liner 610 may be placed on the pull-down transistors 604. It is generally known that compressive stress degrades electron mobility while it enhances hole mobility. Accordingly, the compressive stress liner 608 of the pass-gate 602 produces a high PD/PG ratio, thereby providing improved SRAM stability.

Figure 7:
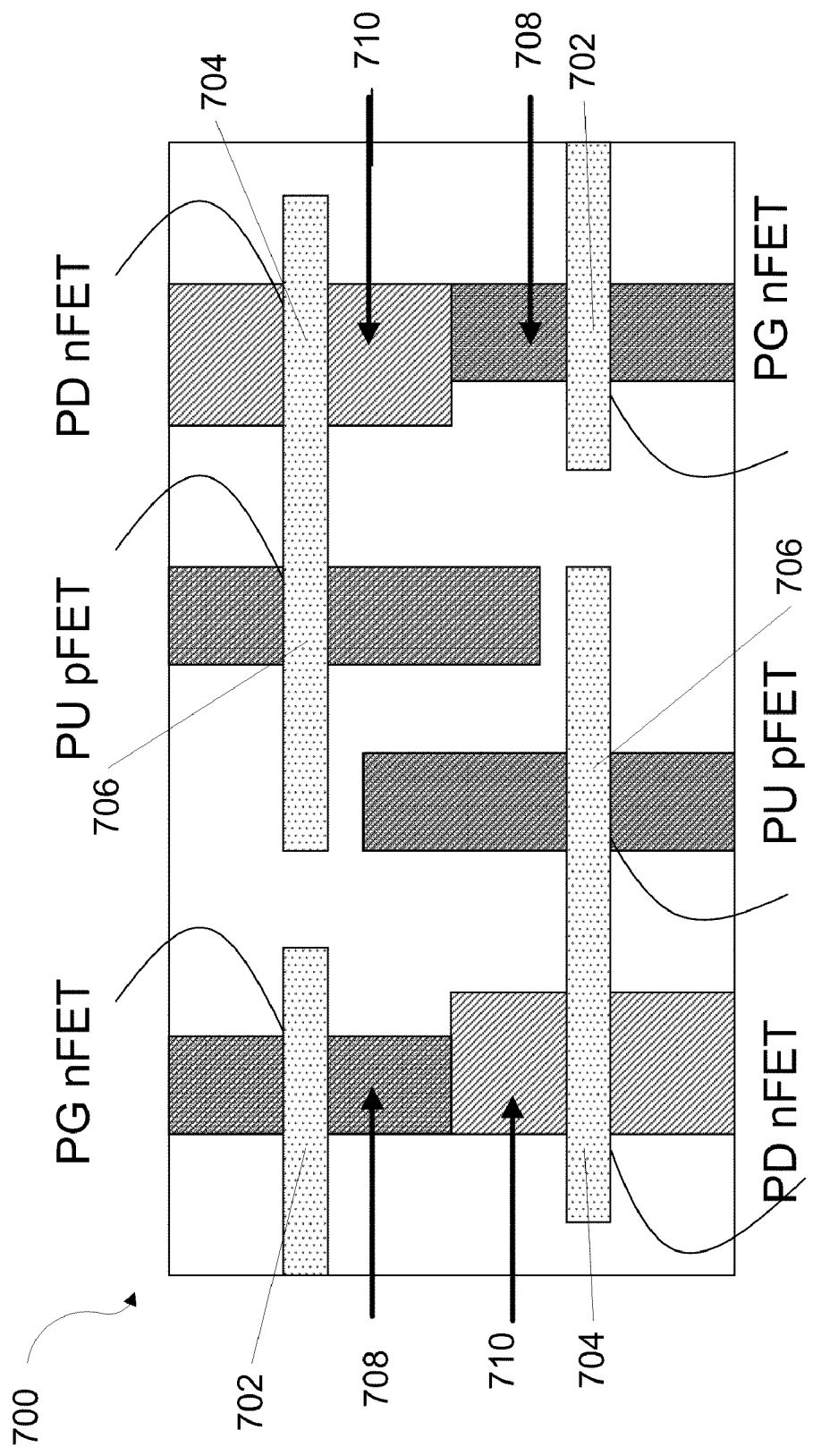
FIG. 7 is a top down image of an SRAM bit cell utilizing embedded silicon germanium to improve SRAM stability in accordance with one or more aspects of the present invention.

FIG. 7 illustrates yet another arrangement for adjusting channel mobility to improve SRAM stability. In the configuration in FIG. 7, silicon germanium (SiGe) 708 may be embedded in the source/drain in the pull-up 706 and pass-gate transistors 702. This embedded SiGe 708 may cause uniaxial compressive stress in the Si channel 710. Accordingly, a high compressive stress is produced in the pass-gate region 702, producing a high PD/PG ratio. Again, this high beta ratio may provide improved SRAM stability.

Gate Capacitance Adjustment

Figure 8:
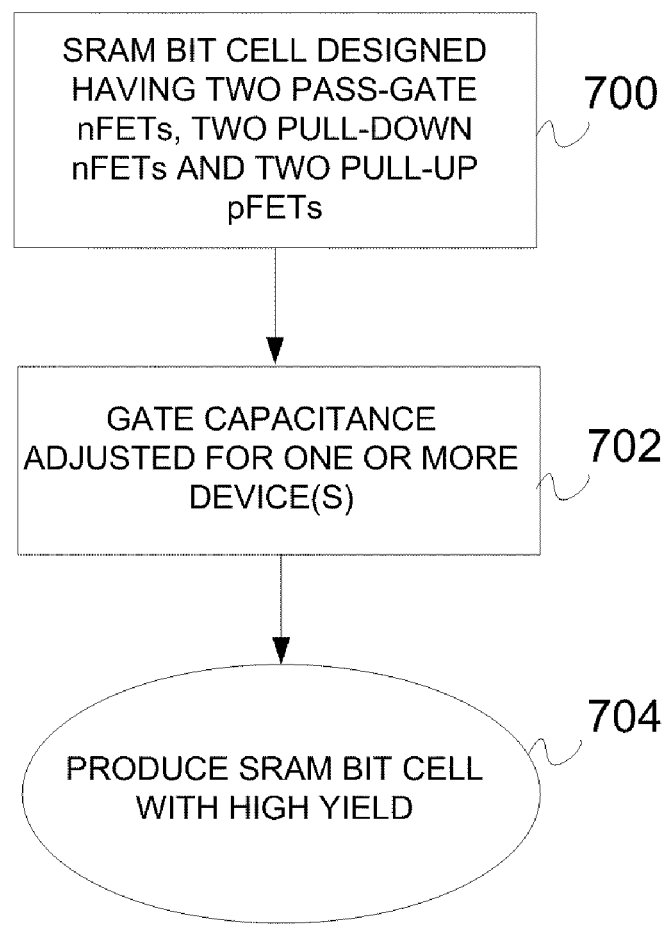
FIG. 8 is a flow diagram showing illustrative steps of one method of producing a high yield SRAM bit cell in accordance with one or more aspects of the present invention.
Figure 9:
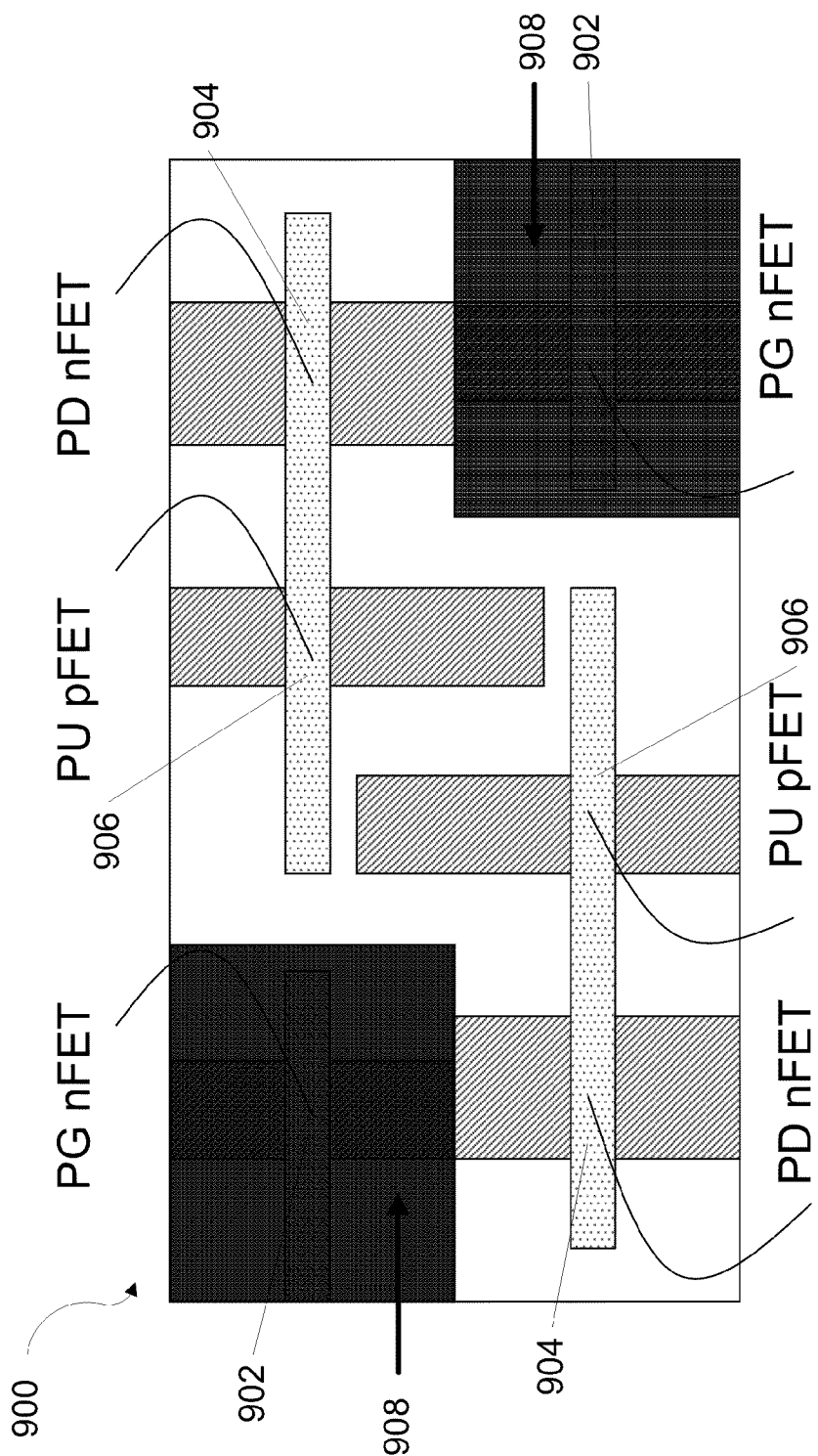
FIG. 9 is a top down image of an SRAM bit cell utilizing thick gate oxide to improve SRAM yield in accordance with one or more aspects of the present invention.

In addition to adjusting channel mobility to improve SRAM stability, gate capacitance of each device may be adjusted to achieve high SRAM yield. FIG. 8 illustrates one method of adjusting gate capacitance to produce high yield SRAM cells. In step 800, an SRAM bit cell is produced having two pass-gate nFETs, two pull-down nFETs and two pull-up nFETs. In step 802, gate capacitance may be altered for pull-down, pass-gate and pull-up FETs. In step 804, a high yield SRAM cell is produced. For example, by using multi-oxide processes or implantation with various transistors, gate oxide thickness may be adjusted to enhance gate capacitance. FIG. 9 illustrates one arrangement in which gate capacitance is adjusted to achieve high SRAM yield. In the arrangement of FIG. 9, a thick gate oxide 908 may be used with the pass-gate transistors 902, but not with the pull-up 906 or pull-down transistors 904. This thick gate oxide 908 may be formed by a wet etching method or other techniques known in the art.

Figure 10:
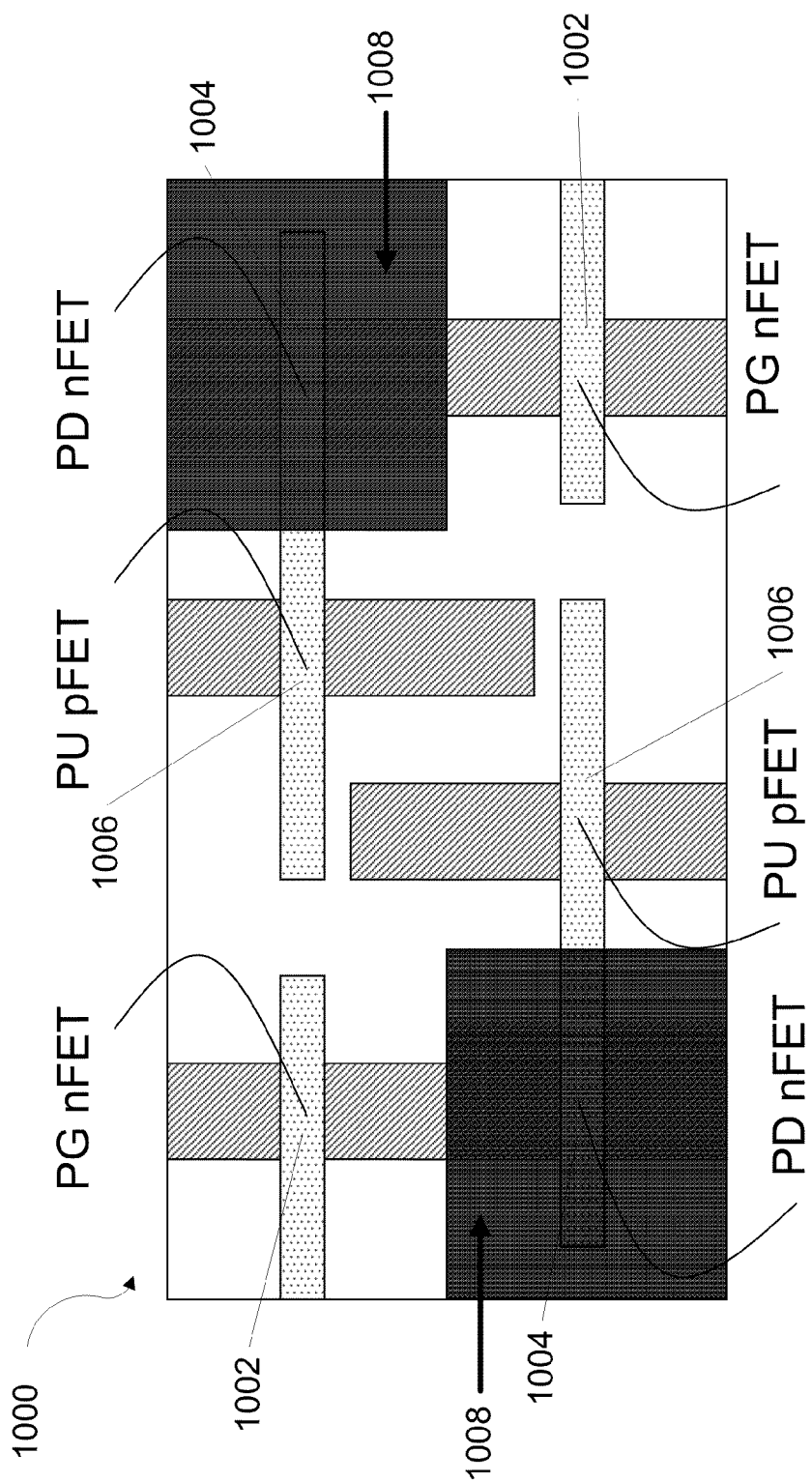
FIG. 10 is a top down image of an SRAM bit cell utilizing phosphorous pre-doping to improve SRAM yield in accordance with one or more aspects of the present invention.

FIG. 10 illustrates another method of adjusting gate capacitance to achieve high SRAM yield. In the configuration of FIG. 10, phosphorous pre-doping 1008 is used in pull-down transistors 1004, but not in pass-gate 1002 or pull-up transistors 1006. It is generally known that phosphorous pre-doping increases gate capacitance at high gate voltage. The processing of the pull-down transistors 1004, coupled with the lack of similar processing on the pass-gate 1002 or pull-up transistors 1006, may produce a high beta ratio. This high beta ratio may provide a higher SRAM yield when compared to conventional cell processes.

Figure 11:
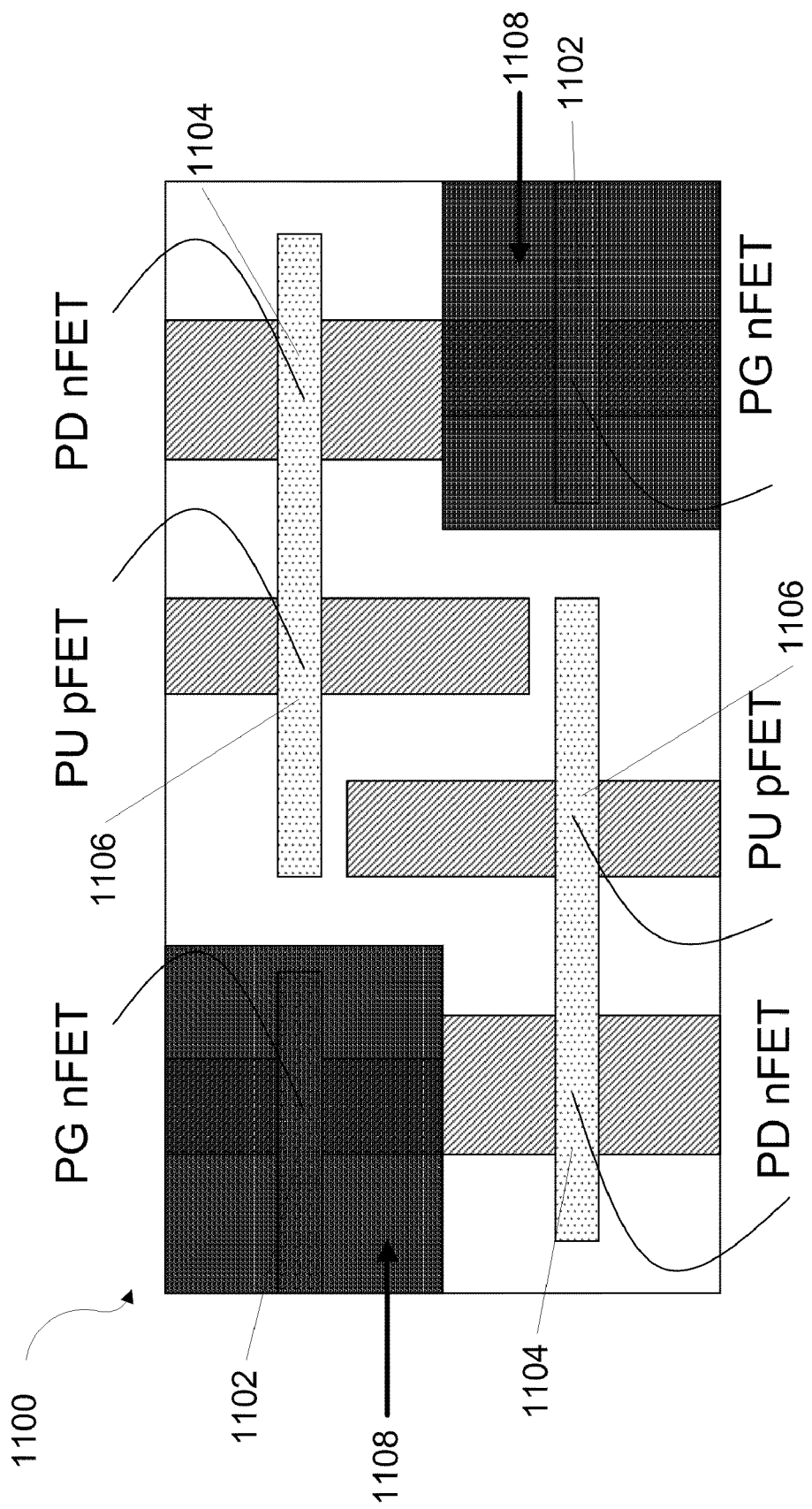
FIG. 11 is a top down image of an SRAM bit cell utilizing fluorine pre-doping to improve SRAM yield in accordance with one or more aspects of the present invention.

FIG. 11 illustrates yet another method of adjusting gate capacitance to achieve high SRAM yield. The configuration of FIG. 11 includes fluorine pre-doping 1108 in the pass-gate region 1102, but not in the pull-up 1106 or pull-down regions 1104. It is generally known that fluorine implanted after a poly-silicon deposition increases gate oxide thickness. In this configuration, the pass-gate transistors 1102 may receive fluorine pre-doping 1108, while the pull-up 1106 and pull-down regions 1104 may not. This processing of the pass-gate transistors 1102, coupled with the lack of similar processing of the pull-up 1106 and pull-down 1104 regions, may decrease the gate capacitance to provide a high SRAM yield.

Figure 12:
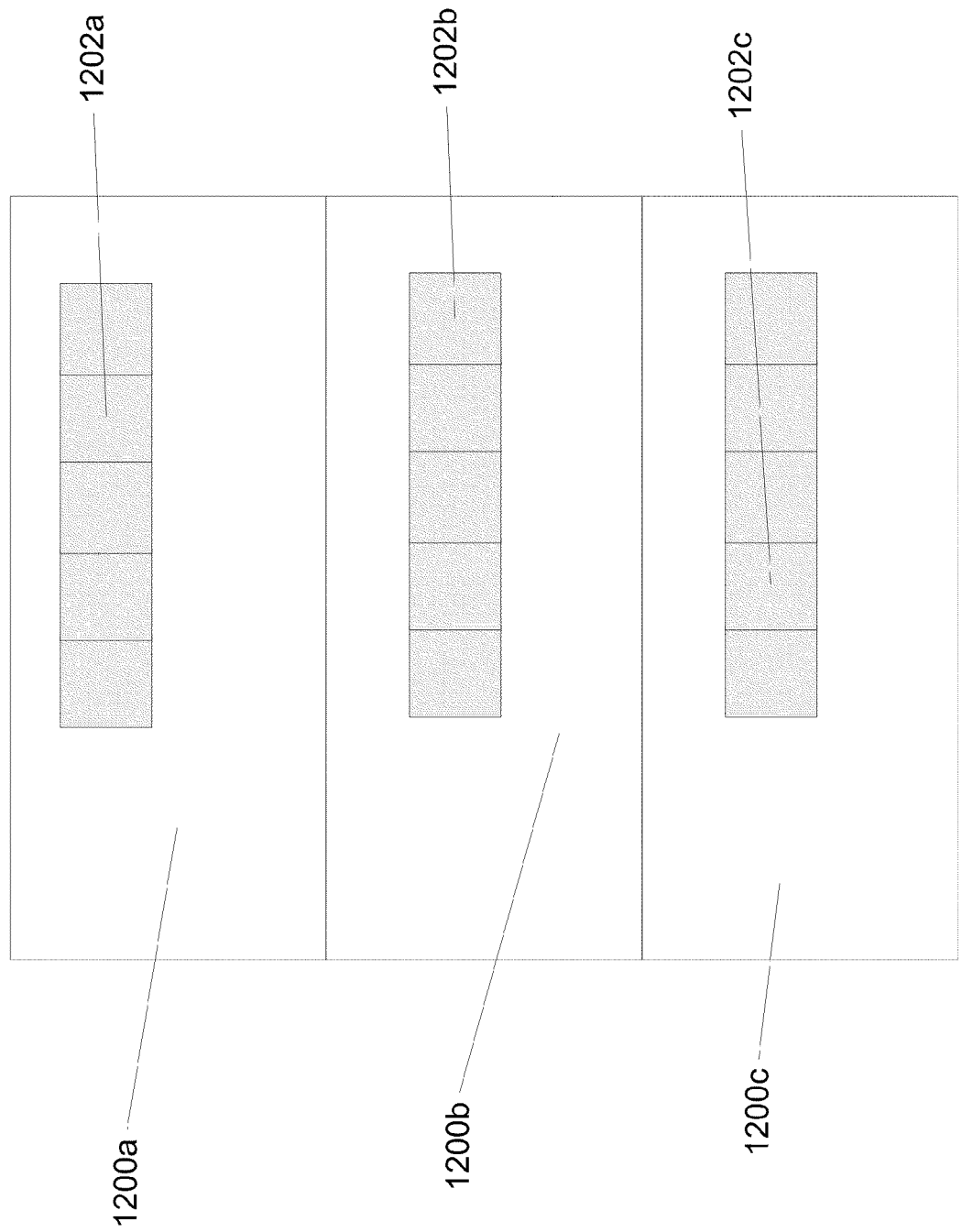
FIG. 12 illustrates SRAM cells that are the same size but are processed according to one or more aspects of the present invention.

FIG. 12 illustrates one example of the arrangements described above. Each of the devices 1202a, 1202b, 1202c within a cell 1200a, 1200b, 1200c may have the same size and shape. However, various processing techniques, as described above, may be used to alter the performance of the cell without altering the size and shape of the device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. Numerous other embodiments, modifications and variations within the scope and spirit of the appended claims will occur to persons of ordinary skill in the art from a review of this disclosure.

What is claimed is:

1. A method of producing a semiconductor device, comprising the steps of:
    forming source and drain regions for the semiconductor device including two pull-down field effect transistors, two pass gate transistors and two pull-up field effect transistors on a substrate; and
    processing to adjust gate capacitance of at least one type of field effect transistor.

2. The method of producing a semiconductor device of claim 1, wherein the step of processing includes using a multi-oxide process to adjust gate oxide thickness.

3. The method of producing a semiconductor device of claim 1, wherein the step of processing includes using implantation to adjust gate oxide thickness.

4. The method of producing a semiconductor device of claim 1, wherein the step of processing includes forming a thick gate oxide in the pass-gate field effect transistor region.

5. The method of producing a semiconductor device of claim 4, wherein the thick gate oxide can be produced by a wet etching method.

6. The method of producing a semiconductor device of claim 1, wherein the step of processing includes using phosphorous pre-doping with the pull-down field effect transistors.

7. The method of producing a semiconductor device of claim 1, wherein the step of processing includes using fluorine pre-doping with the pass-gate field effect transistors.

8. The method of producing a semiconductor device of claim 7, wherein the fluorine is implanted after a polysilicon deposition to increase gate oxide thickness.

9. The method of producing a semiconductor device of claim 1, wherein the pull-down field effect transistors are n-type field effect transistors, the pass gate transistors are n-type field effect transistors and the pull-up field effect transistors are p-type field effect transistors.

10. A semiconductor device, comprising:
    a plurality of p-type field effect transistors having channel regions; and
    a plurality of n-type field effect transistors having channel regions;
    wherein the field effect transistors have common width to length ratios and at least some of the field effect transistors are processed to add relative stress to the field effect transistors' channel regions, and
    the process to add relative stress includes adjusting gate capacitance.

* * * * *